United States Patent
Kim et al.

(10) Patent No.: US 10,497,428 B2
(45) Date of Patent: Dec. 3, 2019

(54) BIT LINE SENSE AMPLIFIER, SEMICONDUCTOR MEMORY DEVICE AND MULTI BIT DATA SENSING METHOD THEREOF

(71) Applicant: Samsung Electronics Co., Ltd., Suwon-si OT (KR)

(72) Inventors: Kyungryun Kim, Seoul (KR); Younghun Seo, Hwaseong-si (KR); Soobong Chang, Incheon (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/143,380

(22) Filed: Sep. 26, 2018

(65) Prior Publication Data
US 2019/0189192 A1    Jun. 20, 2019

(30) Foreign Application Priority Data
Dec. 18, 2017 (KR) .......................... 10-2017-0174424

(51) Int. Cl.
| G11C 11/4091 | (2006.01) |
| G11C 11/56 | (2006.01) |
| G11C 7/10 | (2006.01) |
| G11C 11/4093 | (2006.01) |

(52) U.S. Cl.
CPC .......... *G11C 11/4091* (2013.01); *G11C 7/106* (2013.01); *G11C 11/4093* (2013.01); *G11C 11/565* (2013.01); *G11C 2211/5642* (2013.01)

(58) Field of Classification Search
CPC . G11C 11/4091; G11C 7/106; G11C 11/4093; G11C 11/565; G11C 2211/5642
USPC ........................................................ 365/205
See application file for complete search history.

(56) References Cited

U.S. PATENT DOCUMENTS

| 5,283,761 | A | | 2/1994 | Gillingham |
| 5,293,563 | A | | 3/1994 | Ohta |
| 5,532,955 | A | | 7/1996 | Gillingham |
| 5,612,912 | A | | 3/1997 | Gillingham |
| 5,684,736 | A | | 11/1997 | Chan |
| 5,754,488 | A | * | 5/1998 | Suh .................. G11C 7/062 365/149 |
| 5,859,794 | A | | 1/1999 | Chan |
| 5,917,748 | A | | 6/1999 | Chi et al. |
| 5,978,255 | A | | 11/1999 | Naritake |
| 5,995,403 | A | | 11/1999 | Naritake |

(Continued)

OTHER PUBLICATIONS

Tohru Furuyama / An Experimental 2-bit / Cell Storage DRAM for Macrocell or Memory-on-Logic Application / IEEE Journal of Solid-State Circuits, vol. 24, No. 2, Apr. 1989.

(Continued)

*Primary Examiner* — Fernando Hidalgo
(74) *Attorney, Agent, or Firm* — Muir Patent Law, PLLC

(57) ABSTRACT

A semiconductor memory device includes a memory cell that stores multi-bit data, and a bit line sense amplifier that is connected to a bit line of the memory cell and a complementary bit line corresponding to the memory cell in an open bit line structure. The bit line sense amplifier includes a first latch that sequentially senses a first bit and a second bit of the stored multi-bit data and transmits the sensed first bit to a second latch, and a second latch that senses the transmitted bit from the first latch.

20 Claims, 11 Drawing Sheets

(56) References Cited

U.S. PATENT DOCUMENTS

| | | | |
|---|---|---|---|
| 6,005,799 | A | 12/1999 | Rao |
| 6,034,885 | A | 3/2000 | Chan |
| 6,097,620 | A | 8/2000 | Naritake |
| 6,137,739 | A | 10/2000 | Kim |
| 6,151,237 | A | 11/2000 | Naritake |
| 6,151,260 | A | 11/2000 | Birk |
| RE37,072 | E | 2/2001 | Gillingham |
| 6,310,845 | B1 | 10/2001 | Kanenaga et al. |
| 6,373,765 | B1 | 4/2002 | Birk |
| 6,373,766 | B1 | 4/2002 | Birk |
| 6,556,469 | B2 | 4/2003 | Birk et al. |
| 6,625,075 | B2 | 9/2003 | Birk |
| 7,106,626 | B2 | 9/2006 | Goldman et al. |
| 7,133,311 | B2 | 11/2006 | Liu |
| 7,567,452 | B2 | 7/2009 | Song et al. |
| 7,623,373 | B2 | 11/2009 | Barkley |
| 7,944,766 | B2 | 5/2011 | Senou |
| 9,202,531 | B2 * | 12/2015 | Seo .................. G11C 7/065 |
| 9,240,225 | B2 | 1/2016 | Mueller et al. |
| 9,478,277 | B1 | 10/2016 | Liu |
| 9,997,212 | B1 * | 6/2018 | Finkbeiner ........... G11C 7/1006 |
| 10,185,674 | B2 * | 1/2019 | Lea ................. G11C 7/1006 |
| 2004/0032785 | A1 | 2/2004 | Birk |

OTHER PUBLICATIONS

Peter Gillingham / A Sense and Restore Technique for Multilevel DARM / IEEE Transactions on Circuits and Systems, vol. 43, No. 7, Jul. 1996.
Takashi Okuda et al. / A Four-Level Storage 4-Gb DRAM / IEEE Journal of Solid-State Circuits, vol. 32, No. 11, Nov. 1997.

* cited by examiner

BIT LINE SENSE AMPLIFIER, SEMICONDUCTOR MEMORY DEVICE AND MULTI BIT DATA SENSING METHOD THEREOF

CROSS-REFERENCE TO RELATED APPLICATIONS

This application claims priority under 35 U.S.C. § 119 to Korean Patent Application No. 10-2017-0174424 filed on Dec. 18, 2017, in the Korean Intellectual Property Office, the disclosures of which are incorporated by reference herein in their entireties.

BACKGROUND

Embodiments of the inventive concept described herein relate to a semiconductor memory device, and more particularly, relate to a bit line sense amplifier sensing multi-bit data stored in a memory cell, a semiconductor memory device, and a multi-bit data sensing method thereof.

As a semiconductor memory device, a volatile memory device refers to a memory device that loses data stored therein at power-off. The volatile memory device includes a static random access memory (SRAM), a dynamic random access memory (DRAM), a synchronous DRAM, and the like. In contrast, a nonvolatile semiconductor memory device retains data stored therein even when power is not supplied thereto. For this reason, the nonvolatile semiconductor memory device is typically used to store information that has to be retained regardless of whether power is supplied thereto. In general, a multi-level cell (MLC) technology for storing multi-bit data in one memory cell is being applied to increase the capacity of the nonvolatile memory device.

As the demand on a high-capacity volatile memory device increases, there are attempts to store multi-bit data in one DRAM cell. However, unlike the nonvolatile memory device sensing a level of a threshold voltage, the DRAM sensing the amount of charges stored in a cell capacitor needs restoring sensed data at the same time with a sensing operation. Accordingly, there is a need to accurately control a function of a sense amplifier for the purpose of restoring charges, the amount of which corresponds to sensed multi-bit data, to the cell capacitor after sensing charges stored in the cell capacitor.

To implement a multi-level cell of the DRAM, in a sense amplifier of an open bit line structure sensitive to a small noise or offset, a structure in which a sensing and restoring operation of high reliability is possible is required.

SUMMARY

Embodiments of the inventive concept provide a bit line sense amplifier capable of performing sensing and restoring with high reliability in a multi-level cell semiconductor memory device of an open bit line structure.

According to an exemplary embodiment, a semiconductor memory device includes a memory cell connected to a bit line and configured to store multi-bit data, and a bit line sense amplifier including a first latch and a second latch, and configured to electrically connect to the bit line and a complementary bit line in an open bit line structure. The first latch is configured to sequentially sense a first bit of the stored multi-bit data and transmit the sensed first bit as a first output voltage and an inverted first output voltage to the second latch, and sense a second bit of the stored multi-bit data and output the sensed second bit as a second output voltage and an inverted second output voltage. The second latch is configured to sense the transmitted bit from the first latch and output the sensed transmitted bit as a third output voltage and an inverted third output voltage.

According to an exemplary embodiment, a semiconductor memory device includes a bit line connected to a memory cell configured to store multi-bit data, a complementary bit line provided as an open bit line, a first latch connected to the bit line and the complementary bit line through a first switch and a second switch, respectively, and configured to sequentially sense a first bit of the stored multi-bit data and a second bit of the stored multi-data based on voltages of the bit line and the complementary bit line, and a second latch connected to the first latch through third and fourth switches and connected to the complementary bit line through a fifth switch and the second latch configured to receive the sensed first bit from the first latch and sense the received bit.

According to an exemplary embodiment, a multi-bit data sensing method of a semiconductor memory device formed in an open bit line structure includes sensing a first bit of the multi-bit data stored in a memory cell by a first latch, transmitting the sensed first bit to a second latch, sensing the transmitted bit by the second latch, sensing a second bit of the multi-bit data by the first latch, and restoring a first voltage stored in the second latch and a second voltage stored in the first latch a first voltage, to the memory cell.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
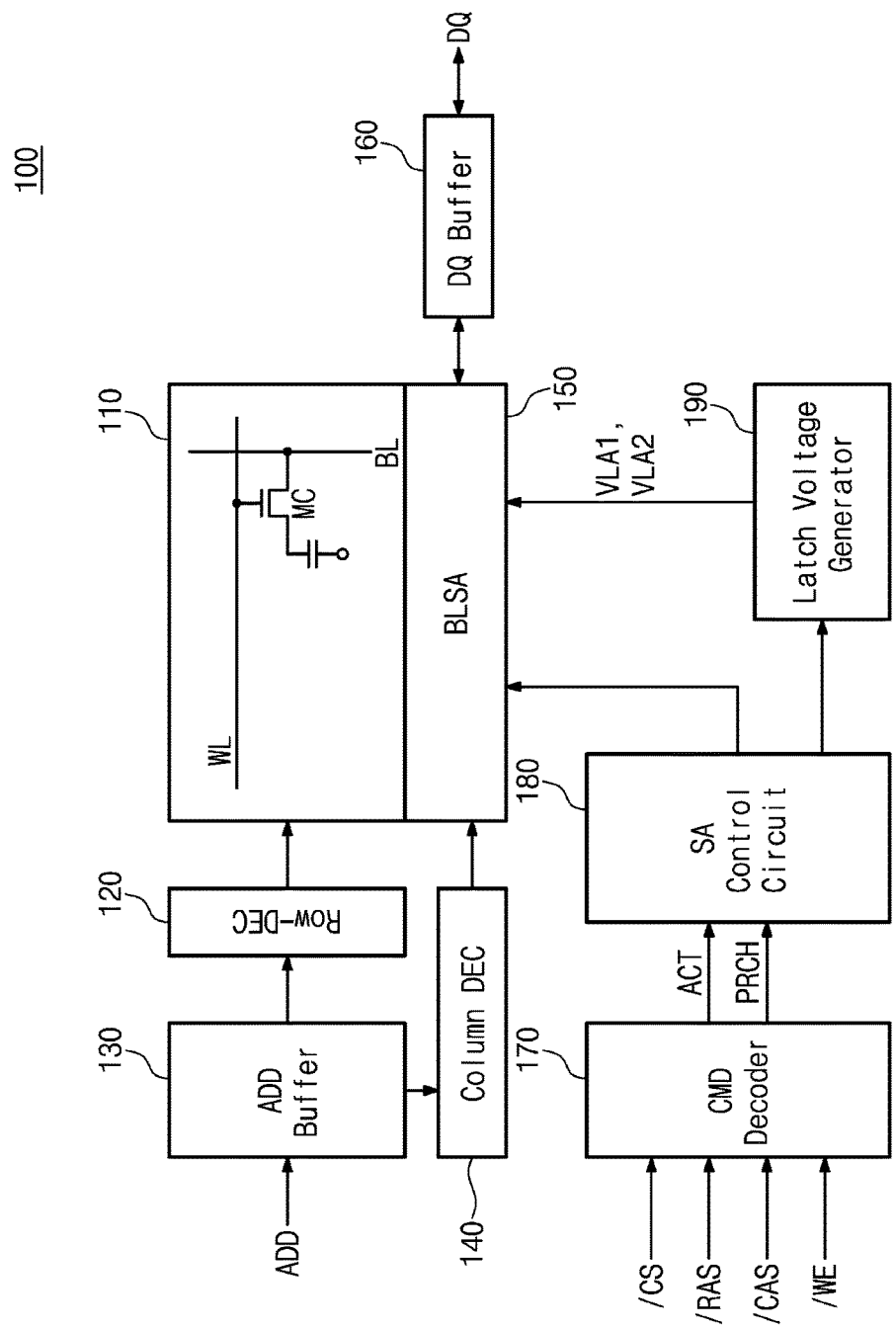
FIG. 1 is a block diagram illustrating a semiconductor memory device according to example embodiments.

It should be understood that both the foregoing general description and the following detailed description are provided as examples, and it should be regarded as an additional description is provided. Reference numerals will be represented in detail in embodiments of the inventive concept, examples of which are illustrated in the accompanying drawings. Wherever possible, the same reference numerals are used in the drawings and the description to refer to the same or similar parts.

Below, a synchronous DRAM (SDRAM) may be used as an example of a semiconductor device for describing features and functions of the inventive concept. However, one skilled in the art may easily understand other merits and performance of the inventive concept depending on the contents disclosed here. The inventive concept may be implemented or applied through other embodiments. In addition, the detailed description may be changed or modified according to view points and applications without departing from the claims, the scope and spirit, and any other purposes of the inventive concept.

FIG. 1 is a block diagram illustrating a semiconductor memory device according to an embodiment of the inventive concept. Referring to FIG. 1, a semiconductor memory device 100 includes a memory cell array 110, a row decoder 120, an address buffer 130, a column decoder 140, a bit line sense amplifier 150, a DQ buffer 160, a command decoder 170, sense amplifier control circuit 180, and a latch voltage generator 190. The memory cell array 110 includes a plurality of memory cells MC that each memory cell operates as a multi-level cell (hereinafter referred to as "MLC"). The bit line sense amplifier 150 may sense and restore multi-bit data by using at least two latches.

Each of the plurality of memory cells MC of the memory cell array 110 may be used as a MLC. The plurality of memory cells MC are connected with word lines and bit lines, and are arranged in a row direction and a column direction. Each of the memory cells MC may include a cell capacitor and an access transistor. In each memory cell, a gate of the access transistor is connected to a word line WL arranged in the row direction. A first end of the access transistor is connected to a bit line BL or a complementary bit line BLB extending in the column direction. A second end of the access transistor may be connected to one end of the cell capacitor. The cell capacitor may store charges, the amount of which varies with multi-bit data. The cell capacitor may be refreshed and/or restored with the amount of charges corresponding to respective multiple data.

The row decoder 120 selects a word line of a memory cell to be accessed, in response to an input address ADD. The row decoder 120 decodes the input address ADD and enables a word line corresponding to the decoded address. Also, in a self-refresh operation mode, the row decoder 120 may decode a row address generated from an address counter (not illustrated) and may enable a word line corresponding to the decoded row address. The column decoder 140 selects a bit line of a memory cell, which data will be input to or will be output from the selected memory cell.

The address buffer 130 temporarily stores the address ADD input from the outside (e.g., a memory controller). The address buffer 130 provides the stored address ADD to the row decoder 120 or the column decoder 140. The address ADD of an external signaling manner may be converted to an internal signaling manner of the semiconductor memory device 100 by the address buffer 130.

The bit line sense amplifier 150 may write multi-bit data in a memory cell by using a selected bit line. The bit line sense amplifier 150 may sense (or, amplify) multi-bit data stored in a selected memory cell and may provide the sensed data to the DQ buffer 160. Also, the bit line sense amplifier 150 may further include components for storing input data in a selected memory cell. Alternatively, the bit line sense amplifier 150 may rewrite multi-bit data stored in a memory cell in a self-refresh mode. The bit line sense amplifier 150 may be connected to memory cells in an open bit line structure.

In example embodiments, the bit line sense amplifier 150 includes at least two latches electrically connected to a bit line pair BL and BLB arranged in the open bit line structure. Here, a bit line BL and a complementary bit line BLB are provided in opposition to each other with respect to the bit line sense amplifier 150, the bit line BL and the complementary bit line BLB have an open bit line structure. For example, a first set of memory cells connected to the bit line BL are arranged in a left side of the bit line sense amplifier 150 and a second set of memory cells connected to the complementary bit line BLB are arranged in a right side of the bit line sense amplifier 150. It will be appreciated that reference to bit line BL and complementary bit line BLB herein is to assist the description. However, each bit line may function as a bit line BL during certain access operations and function as a complementary bit line BLB in other access operations, and the disclosed embodiments should be understood as such. One of the two latches may sense data stored in a memory cell through the bit line pair BL and BLB, and the other thereof may latch the sensed data. For example, one latch performs sensing, and the other latch stores at least one data bit of sensed multiple data bits. In a restore operation, the bit line BL may be charged to a voltage level corresponding to one data bit of the sensing multiple data bits, and the complementary bit line BLB may be charged to a voltage level corresponding to the other data bit. Such a structure is possible by differently setting voltages of latches included in the bit line sense amplifier 150.

The DQ buffer 160 temporarily stores write data input from the outside (e.g., a memory controller) and transmits the write data to the bit line sense amplifier 150. The DQ buffer 160 outputs sensed data transmitted from the bit line sense amplifier 150 to the outside. The DQ buffer 160 may transmit multi-bit data to the bit line sense amplifier 150 and may output multi-bit data sensed from the bit line sense amplifier 150 to the outside. The DQ buffer 160 may include a main sense amplifier (not shown) to read data from the memory cell array 110 and a write buffer (not shown) to write data to the memory cell array 110.

The command decoder 170 determines an input command with reference to signals /CS, /RAS, /CAS, and /WE applied from the outside. In a typical DRAM, an active command and an auto refresh command are determined by a combination of the signals /CS, /RAS, /CAS, and /WE. Also, a self-refresh command may be identified by a combination of an auto refresh command and a clock enable signal CKE. The command decoder 170 may decode an active command and a precharge command and may provide an active signal ACT or a precharge signal PRCH to the sense amplifier control circuit 180.

The sense amplifier control circuit 180 controls the bit line sense amplifier 150 under control of the command decoder 170. In particular, the sense amplifier control circuit 180 may allow the bit line sense amplifier 150 to write and sense multi-bit data. For example, it is assumed that the memory cell MC is driven as a 2-bit multi-level cell. According to the assumption, the sense amplifier control circuit 180 may allow the bit line sense amplifier 150 to sense a most significant bit MSB through a first latch and to store the sensed most significant bit MSB in a second latch. Then, the sense amplifier control circuit 180 may sense a least significant bit LSB depending on a bit value of the most significant bit MSB stored in the second latch and may store the least significant bit LSB in the first latch. If the most significant bit MSB and the least significant bit LSB are completely sensed, for example, latched and amplified, the sense amplifier control circuit 180 may allow the bit line sense amplifier 150 to perform restoring on the memory cell MC. For example, the sense amplifier control circuit 180 may control the bit line sense amplifier 150 such that the most significant bit MSB is restored in the memory cell MC through the complementary bit line BLB and the least significant bit LSB is restored in the memory cell MC through the bit line BL.

The latch voltage generator 190 provides latch driving voltages VLA1 and VLA2 of different levels to the first and second latches included in the bit line sense amplifier 150. For example, the latch voltage generator 190 provides the latch driving voltages VLA1 and VLA2 such that a voltage difference (hereinafter referred to as a "first delta voltage") of a pull-up terminal and a pull-down terminal of the first latch and a voltage difference (hereinafter referred to as a "second delta voltage") of a pull-up terminal and a pull-down terminal of the second latch are different from each other. A configuration and a function of each latch included in the bit line sense amplifier 150 will be more fully described with reference to accompanying drawings.

According to the structure of the semiconductor memory device 100 described above, the bit line sense amplifier 150 includes latches that latch data by using different delta voltages and perform a restore operation. Any one latch takes complete charge of a function of sensing data of a memory cell through the bit line pair BL and BLB. For example, the first latch senses the most significant bit MSB of multi-bit data and transmits the sensed most significant bit MSB to the second latch. After the most significant bit MSB is transmitted to the second latch, the first latch may sense the least significant bit LSB. In the restore operation, the first latch and the second latch charge the complementary bit line BLB and the bit line BL by using voltages corresponding to stored data. In this case, since the first latch and the second latch use different delta voltages, the amount of charges to be restored to the memory cell may be transmitted as a value corresponding to multi-bit data.

Figure 2:
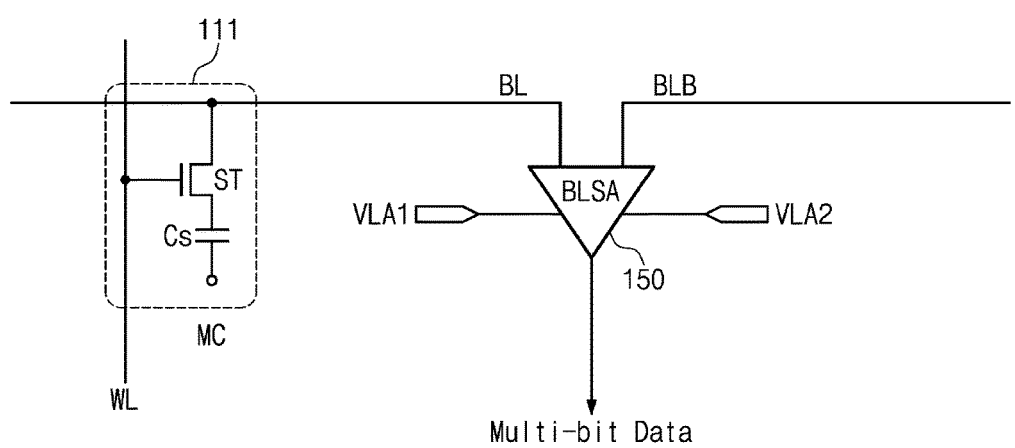
FIG. 2 is a view illustrating a multi-level cell and a bit line sense amplifier of an open bit line structure, according to example embodiments.

FIG. 2 is a view illustrating a MLC and a bit line sense amplifier of an open bit line structure, according to an embodiment of the inventive concept. Referring to FIG. 2, the semiconductor memory device 100 includes a memory cell 111 and the bit line sense amplifier 150.

The memory cell 111 is connected to the bit line BL and a word line WL. The memory cell 111 may include an access transistor ST and a cell capacitor Cs. A gate of the access transistor ST is connected to the word line WL, and a first end of the access transistor ST is connected to the bit line BL. The memory cell 111 may be controlled to operate as a MLC. The cell capacitor Cs of the memory cell 111 may store multi-bit data. For example, the cell capacitor Cs may be charged with any one of charge amounts of at least four distinguishable levels for the purpose of storing 2-bit data.

The bit line sense amplifier 150 is connected with memory cells through the bit line pair BL and BLB. For example, the bit line sense amplifier 150 may sense and restore multi-bit data stored in the memory cell 111 through the bit line BL. The bit line sense amplifier 150 is connected with memory cells in the open bit line structure. The bit line sense amplifier 150 may sense charges charge-shared through the bit line BL and the memory cell 111 and may output the sensed result as multi-bit data. The bit line sense amplifier 150 includes at least two latches for the purpose of sensing multi-bit data. A first latch latches sensed data by using the first latch driving voltage VLA1. A second latch latches 1-bit data sensed by the first latch by using the second latch driving voltage VLA2.

The bit line sense amplifier 150 restores the sensed multi-bit data latched through the first latch and the second latch to the memory cell 111 by using the bit line BL and the complementary bit line BLB. The first latch that takes complete charge of sensing data stored in the memory cell 111 may also perform, for example, an offset cancellation operation in a sensing operation.

Figure 3:
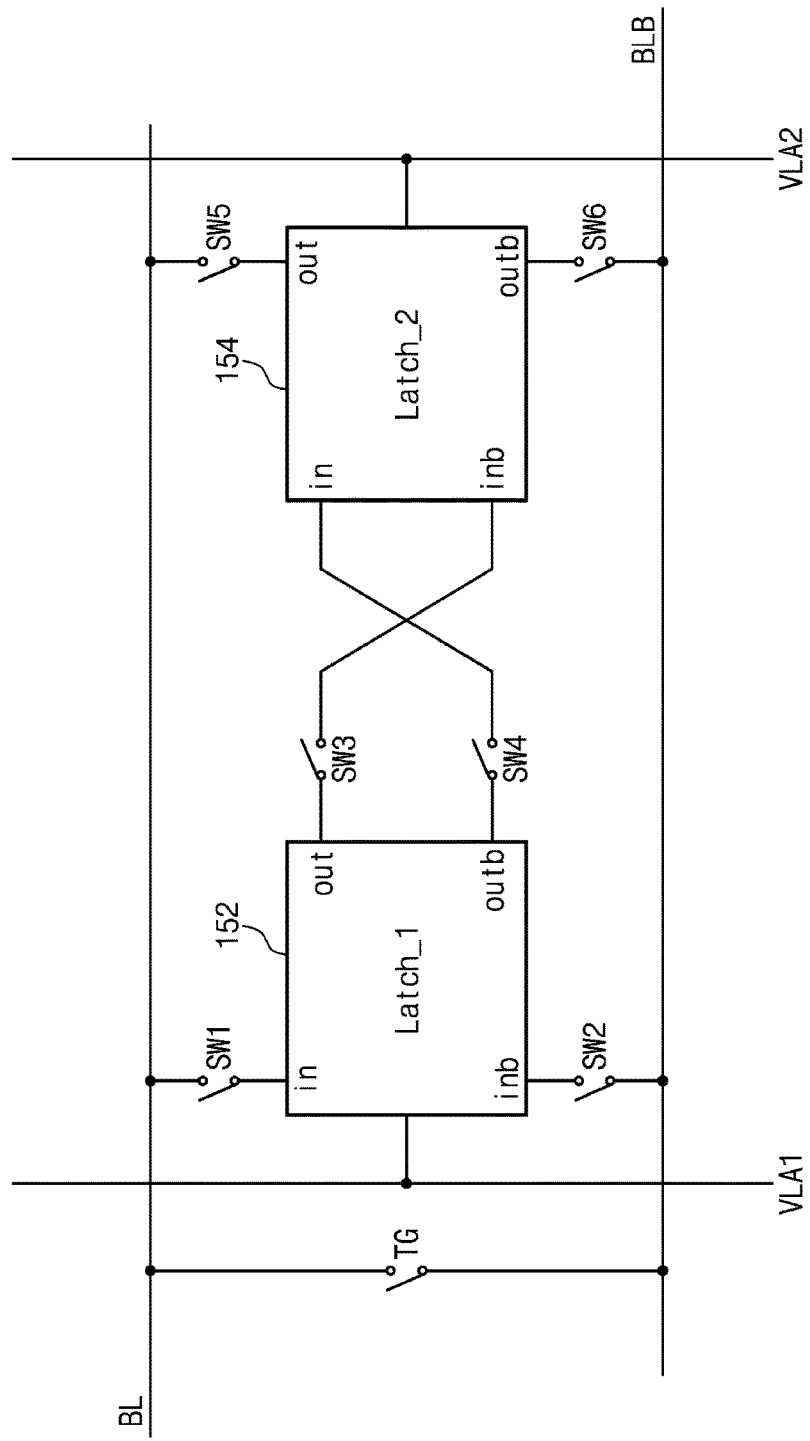
FIG. 3 is a block diagram schematically illustrating a configuration of a bit line sense amplifier according to example embodiments.

FIG. 3 is a block diagram schematically illustrating a configuration of a bit line sense amplifier according to an embodiment of the inventive concept. Referring to FIG. 3, the bit line sense amplifier 150 includes a first latch 152 and a second latch 154. Through the first latch 152 and the second latch 154, the bit line sense amplifier 150 may perform data sensing and restore operations of high reliability in a memory cell array of an open bit line structure.

The first latch 152 is connected with the bit line BL by using a first switch SW1. Hereinafter, each switch may be implemented by at least one transistor. The first latch 152 may be connected with the complementary bit line BLB by using a second switch SW2. The first latch 152 may be provided with the first latch driving voltage VLA1 from the latch voltage generator 190. The first latch driving voltage VLA1 includes both a sensing enable voltage VDD1 provided to a pull-up terminal of the first latch 152 and a sensing enable voltage VSS1 provided to a pull-down terminal of the first latch 152. A voltage level of the sensing enable voltage VDD1 is greater than a voltage level of the sensing enable voltage VSS1. A first delta voltage $\Delta V1$ that is a voltage difference between the pull-up terminal and the pull-down terminal may be maintained by the sensing enable voltages VSS1 and VDD1.

The second latch 154 is connected with the bit line BL by using a fifth switch SW5. The second latch 154 may be connected with the complementary bit line BLB by using a sixth switch SW6. The second latch 154 may be provided with the second latch driving voltage VLA2 from the latch voltage generator 190. The second latch driving voltage VLA2 includes both a sensing enable voltage VDD2 provided to a pull-up terminal of the second latch 154 and a sensing enable voltage VSS2 provided to a pull-down terminal of the second latch 154. A voltage level of the sensing enable voltage VDD2 is greater than a voltage level of the sensing enable voltage VSS2. The second latch driving voltage VLA2 may be provided as a voltage set for providing a second delta voltage $\Delta V2$ that is a voltage difference between the pull-up terminal and the pull-down terminal of the second latch 154. The second latch 154 may not perform sensing on the memory cell 111 through the bit line pair BL and BLB.

In example embodiments, a first end of the first switch SW1 is connected to a first node N1 of the bit line BL and a second end of the first switch SW1 is connected to the first latch 152, and a first end of the fifth switch SW5 is directly connected to the first node N1 of the bit line BL and a second end of the fifth switch SW5 is connected to the second latch 154. Also, a first end of the second switch SW2 is connected to the first latch 152 and a second end of the second switch SW2 is connected to a second node N2 of the complementary bit line BLB, and a first end of the sixth switch SW6 is connected to the second latch 154 and a second end of the sixth switch SW6 is directly connected to the second node N2 of the complementary bit line BLB. Accordingly, an operation speed of the bit line sense amplifier 150 may be increased thus a read, a write, a refresh, and a restore operation may be improved.

As used herein, items that are "directly connected," to each other may be connected through one or more conductors, such as, for example, wires, pads, internal electrical lines, through vias, etc., and may form the same electrical node. As such, directly connected components do not include components connected through active elements, such as transistors or diodes (although such connections may form an electrical connection). Directly connected elements may be directly physically connected (e.g., in contact with each other).

The first latch 152 and the second latch 154 are connected through third and fourth switches SW3 and SW4. The first latch 152 may sequentially sense multi-bit data stored in the memory cell 111 through the bit line pair BL and BLB. Data MSB or LSB, which the first latch 152 first senses, from among multi-bit data are transmitted to the second latch 154 through the third and fourth switches SW3 and SW4.

In one embodiment, first bit data sensed by the first latch 152 are inverted and the inverted first bit data are stored in the second latch 154. For example, output nodes out and outb of the first latch 152 are connected to input nodes inb and in of the second latch 154 by the third and fourth switches SW3 and SW4 in a twisted form. For example, the output node out of the first latch 152 is connected to the inverted input node inb of the second latch 154 by the third switch SW3. The inverted output node outb of the first latch 152 is connected to the input node in of the second latch 154 by the fourth switch SW4.

In another embodiment, the first bit data sensed by the first latch 152 are not inverted and the first bit data are stored in the second latch 154. For example, output nodes out and outb of the first latch 152 are connected to input nodes in and inb of the second latch 154 by the third and fourth switches SW3 and SW4 in a straight form, respectively. For example, the output node out of the first latch 152 is connected to the input node in of the second latch 154 by the third switch SW3. The inverted output node outb of the first latch 152 is connected to the inverted input node inb of the second latch 154 by the fourth switch SW4.

In the restore operation, a transmission gate TG adds charges, which correspond to multi-bit data and are charged in the bit line BL and the complementary bit line BLB, and transmits the added charges to the memory cell 111. For example, in the restore operation, charges corresponding to any one data bit (e.g., LSB) of multi-bit data may be supplied to the bit line BL by the first latch 152. To this end, the first switch SW1 is turned on, and the second switch SW2 is turned off. At the same time, charges corresponding to any one data bit (e.g., MSB) of the multi-bit data may be supplied to the complementary bit line BLB by the second latch 154. To this end, the sixth switch SW6 is turned on, and the fifth switch SW5 is turned off. When the transmission gate TG is turned on, charges that correspond to the least significant bit LSB and are charged in the bit line BL and charges that correspond to the most significant bit MSB and are charged in the complementary bit line BLB may be transmitted to the bit line BL so as to be stored in the cell capacitor Cs of the memory cell 111.

The principle where the first latch 152 and the second latch 154 sense and restore different bits of multi-bit data may come from the latch driving voltages VLA1 and VLA2 setting the delta voltages $\Delta V1$ and $\Delta V2$ of different magnitudes.

Figure 4:
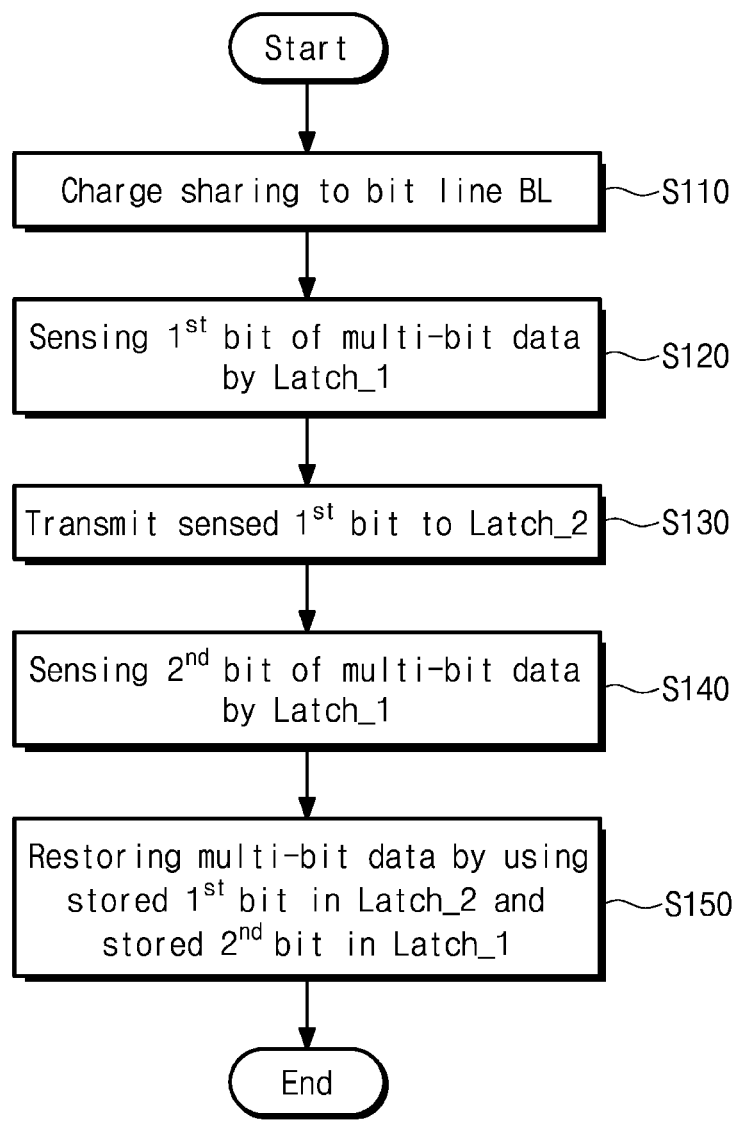
FIG. 4 is a flowchart illustrating an operation of sense amplifier control logic controlling a sensing operation of the bit line sense amplifier of FIG. 3 according to example embodiments.

FIG. 4 is a flowchart illustrating an operation of sense amplifier control logic controlling a sensing operation of a bit line sense amplifier of FIG. 3 according to example embodiments. An operation procedure for sensing and restoring multi-bit data through latches of the bit line sense amplifier 150 will be described with reference to FIG. 4.

In operation S110, charges stored in the cell capacitor Cs are shared with the bit line BL through the process of charge sharing when a word line of a selected memory cell 111 is activated. For the charge sharing, the sense amplifier control circuit 180 may turn on an isolation transistor that electrically connects or isolates the bit line BL to or from the memory cell 111. Charges corresponding to multi-bit data may be transmitted to and stored in the bit line BL through the process of charge sharing.

In operation S120, a first bit (e.g., MSB) is sensed through the first latch 152. For example, the first switch SW1 and the second switch SW2 are turned on, and the first latch 152 senses the shared charges stored in the bit line BL to latch the first bit of the multi-bit data. In operation S120, the first latch 152 may amplify a voltage of the bit line BL by supplying the first delta voltage $\Delta V1$ from the latch voltage generator 190.

In operation S130, the first latch 152 transmits the sensed first bit to the second latch 154. The sense amplifier control circuit 180 may turn on the switches SW3 and SW4 such that a logical value corresponding to the first bit latched in the first latch 152 is transmitted to the second latch 154. For example, not the first bit sensed and stored in the first latch 152 but an inverted logical value of the first bit is transmitted to the second latch 154.

In operation S140, the first latch 152 may sense a second bit (e.g., LSB) under control of the sense amplifier control circuit 180. That is, while the first switch SW1 and the second switch SW2 are turned on, the first latch 152 senses the shared charges stored in the bit line BL to latch the second bit of the multi-bit data. Reference voltages (e.g., voltages of the input nodes) of the first latch 152 may be changed to sense and latch the second bit.

In operation S150, the sense amplifier control circuit 180 restores the multi-bit data stored in the first latch 152 and the second latch 154 to the memory cell 111 by using a voltage level corresponding to the multi-bit data. First, the sense amplifier control circuit 180 turns off the switches SW2, SW3, SW4, and SW5 and turns on the transmission gate TG. The bit line BL and the complementary bit line BLB may be charged to a voltage level corresponding to the second bit stored in the first latch 152 and a voltage level corresponding to the first bit stored in the second latch 154. As such, charges corresponding to the second bit may be transmitted to the memory cell 111 through the bit line BL, and charges corresponding to the first bit may be transmitted to the memory cell 111 through the complementary bit line BLB.

An operating method of the bit line sense amplifier 150 according to an embodiment of the inventive concept is briefly described above. According to an embodiment of the inventive concept, the first latch 152 and the second latch 154 may use different delta voltages $\Delta V1$ and $\Delta V2$ for the purpose of storing and restoring multi-bit data. Accordingly, even though the capacity of the bit line BL and the capacity of the complementary bit line BLB are identical to each other, sensing and restoring the most significant bit MSB and the least significant bit LSB may be easily performed.

Figure 5:
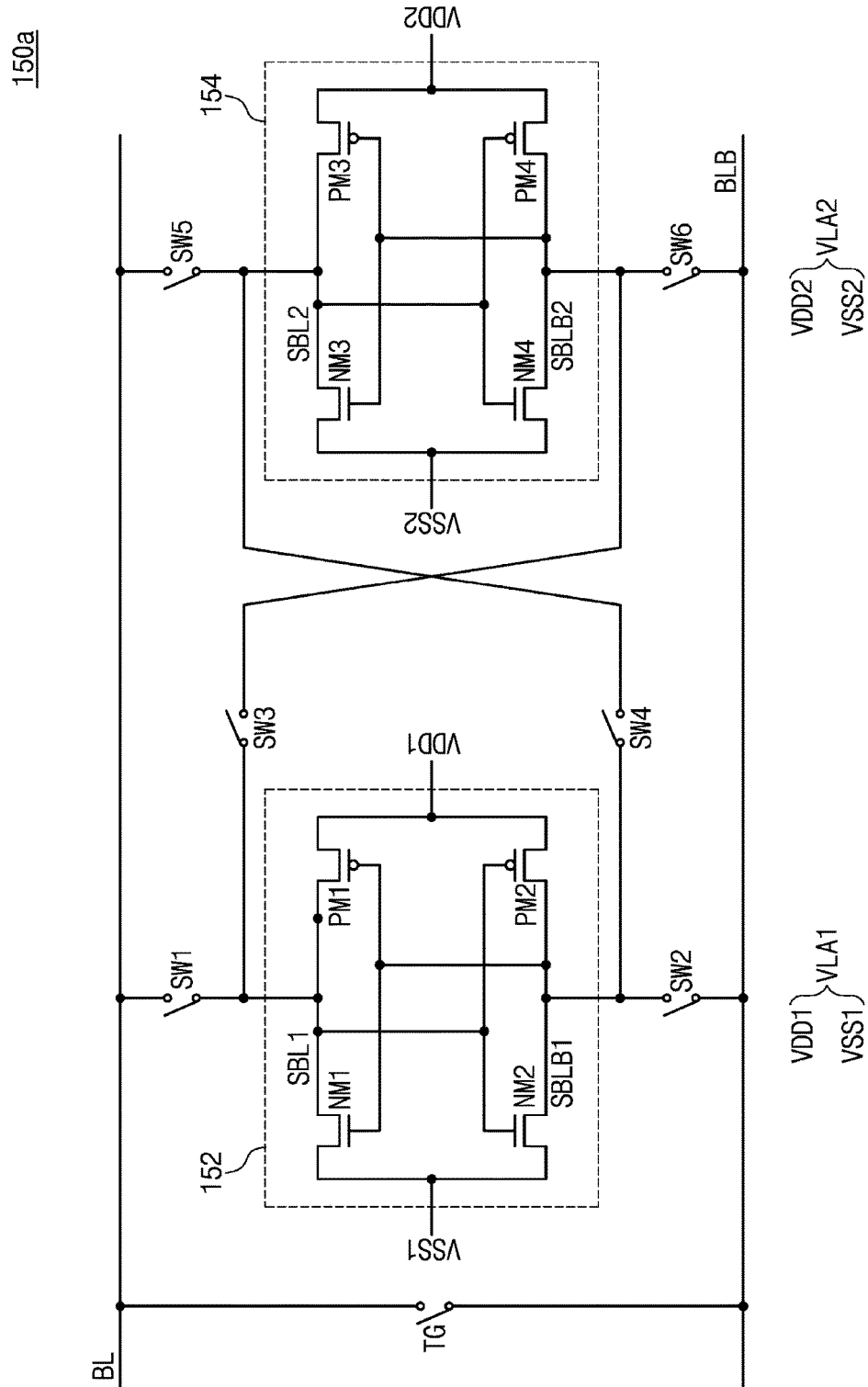
FIG. 5 is a circuit diagram illustrating an exemplary configuration of a bit line sense amplifier of FIG. 3 according to example embodiments.

FIG. 5 is a circuit diagram illustrating an exemplary configuration of a bit line sense amplifier of FIG. 3 according to example embodiments. Referring to FIG. 5, a bit line sense amplifier 150a according to an embodiment of the inventive concept may include the first latch 152 sensing data by using the sensing enable voltages VSS1 and VDD1, the second latch 154 sensing data by using the sensing enable voltages VSS2 and VDD2, and the transmission gate TG.

The first latch 152 may include PMOS transistors PM1 and PM2 for constituting a pull-up stage and NMOS transistors NM1 and NM2 for constituting a pull-down stage. The first latch 152 may sense a voltage change of the bit line pair BL and BLB to latch data stored in the memory cell 111. A drain of the PMOS transistor PM1 or a drain of the NMOS transistor NM1 forms a first sense amplifier bit line SBL1. A drain of the PMOS transistor PM2 or a drain of the NMOS transistor NM2 forms a first inverted sense amplifier bit line SBLB1. The first sense amplifier bit line SBL1 and the first inverted sense amplifier bit line SBLB1 may operate as an input node or an output node of the first latch 152. For example, the first sense amplifier bit line SBL1 may be referred to as a first output node and the first inverted sense amplifier bit line SBLB1 may be referred to as a second output node. A common gate of the PMOS transistor PM1 and the NMOS transistor NM1 may form a first input node. A common gate of the PMOS transistor PM2 and the NMOS transistor NM2 may form a second input node.

For example, in a sensing operation of the first latch 152, the switches SW1 and SW2 may be turned on, and thus, voltage changes of the bit line pair BL and BLB may be transmitted to the first sense amplifier bit line SBL1 and the first inverted sense amplifier bit line SBLB1. In contrast, after data are completely sensed, the switches SW1 and SW2 are turned off, and the switches SW3 and SW4 are turned on. As such, a voltage level defined by the first sense amplifier bit line SBL1 and the first inverted sense amplifier bit line SBLB1 is transmitted to and inverted in the second latch 154.

The sensing enable voltages VSS1 and VDD1 are provided to the pull-down and pull-up terminals of the first latch 152. Accordingly, the first delta voltage $\Delta V1$ (=VDD1–VSS1) corresponding to a voltage difference of the pull-up and pull-down terminals of the first latch 152 may be formed. The sensing enable voltages VSS1 and VDD1 may be provided by the latch voltage generator 190 (refer to FIG. 1) described above.

In the sensing operation of the first latch 152, a minute voltage change of the bit line BL through the process of charge sharing may be transmitted to the first sense amplifier bit line SBL1, and thus, a gate voltage of the NMOS transistor NM2 and the PMOS transistor PM2 may increase or decrease. As a voltage of the bit line BL is changed, any one of the NMOS transistor NM2 and the PMOS transistor PM2 is turned on, and the other thereof is turned off. Through the above-described process, data are sensed and amplified.

The second latch 154 may include PMOS transistors PM3 and PM4 for constituting a pull-up stage and NMOS transistors NM3 and NM4 for constituting a pull-down stage. The second latch 154 may not perform sensing on the bit line pair BL and BLB. A drain of the PMOS transistor PM3 or a drain of the NMOS transistor NM3 forms a second inverted sense amplifier bit line SBLB2. A drain of the PMOS transistor PM4 or a drain of the NMOS transistor NM4 forms a second sense amplifier bit line SBL2. The second sense amplifier bit line SBL2 and the second inverted sense amplifier bit line SBLB2 may operate as an input node or an output node of the first latch 152. For example, the second sense amplifier bit line SBL2 may form a first output node and the second inverted sense amplifier bit line SBLB2 may form a second output node. A common gate of the PMOS transistor PM3 and the NMOS transistor NM3 may form a first input node. A common gate of the PMOS transistor PM4 and the NMOS transistor NM4 may form a second input node. If the switches SW3 and SW4 are turned on, the second inverted sense amplifier bit line SBLB2 is connected to the first inverted sense amplifier bit line SBLB1, and the second sense amplifier bit line SBL2 is connected to the first sense amplifier bit line SBL1. According to this configuration (or structure), data latched by the first latch 152 are transmitted to and inverted in the second latch 154.

The sensing enable voltages VSS2 and VDD2 are provided to the pull-down and pull-up terminals of the second latch 154. Accordingly, the second delta voltage $\Delta V2$ (=VDD2–VSS2) corresponding to a voltage difference of the pull-up and pull-down terminals of the second latch 154 may be formed. The sensing enable voltages VSS2 and VDD2 may be provided from the latch voltage generator 190 (refer to FIG. 1) described above. It may be well understood that any one of the sensing enable voltages VSS2 and VDD2 is a negative voltage.

In the restore operation where multi-bit data are restored in the memory cell 111, the first latch 152 may charge the bit line BL depending on a logical value of the first bit (or LSB) stored therein. For example, in the restore operation, the first latch 152 may be connected with the bit line BL through the switch SW1 and may charge the bit line BL with any one of the sensing enable voltages VSS1 and VDD1 corresponding to the first bit (or LSB). In the restore operation, the second latch 154 may charge the complementary bit line BLB depending on a logical value of the second bit (or MSB) stored therein. For example, in the restore operation, the second latch 154 may be connected with the complementary bit line BLB through the switch SW6 and may charge the complementary bit line BLB with any one of the sensing enable voltages VSS2 and VDD2 corresponding to the second bit (or MSB).

When the transmission gate TG is turned on, the bit line pair BL and BLB that are charged with voltages corresponding to logical values of the first and second bits in the restore operation are connected with the cell capacitor Cs of the memory cell 111. In the restore operation, the switches SW2, SW3, SW4, and SW5 may maintain a turn-off state.

Figure 6:
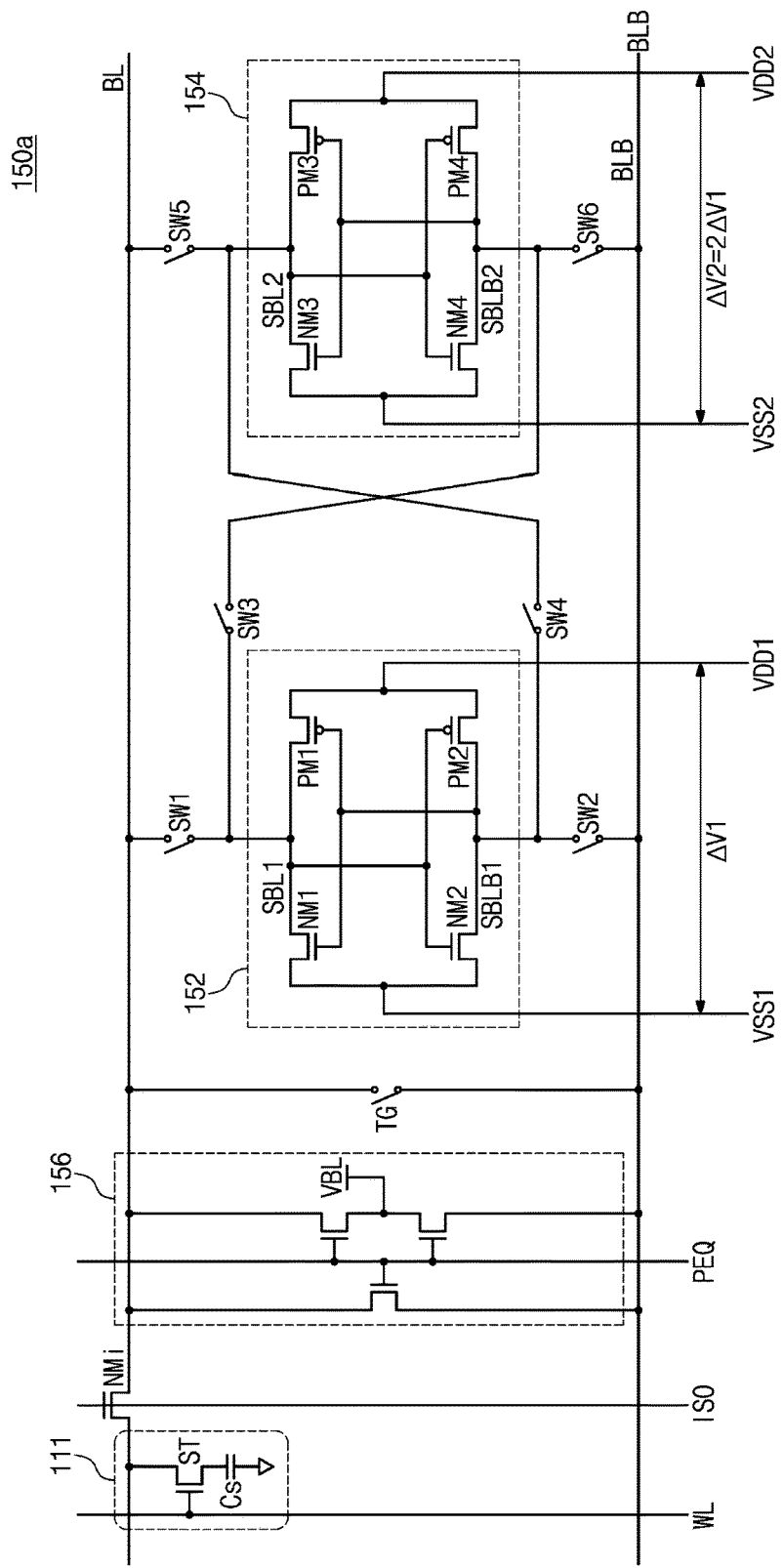
FIG. 6 is a circuit diagram illustrating a bit line sense amplifier of FIG. 5 connected to a memory cell according to example embodiments.

FIG. 6 is a circuit diagram illustrating a bit line sense amplifier of FIG. 5 connected to a memory cell according to example embodiments. Referring to FIG. 6, the bit line sense amplifier 150a and the memory cell 111 that are arranged in the open bit line structure are connected by an isolation transistor NMi. In the open bit line structure, a first set of memory cells including the memory cell 111 that are connected to the bit line BL are arranged at a first side of (and connected to) the bit line sense amplifier 150a and a second set of memory cells connected to the complementary bit line BLB are arranged at a second side of (and connected to) the bit line sense amplifier 150a, opposite to the first side of the bit line sense amplifier 150a. When the bit line sense amplifier 150a senses data stored in the memory cell 111, the isolation transistor NMi connected to the bit line BL is turned on by an isolation control signal ISO and the other isolation transistor NMj (not shown) connected to the complementary bit line BLB is turned off by an inverted isolation control signal ISOB (not shown).

The memory cell 111 includes an access transistor ST and a cell capacitor Cs. A gate of the access transistor ST of the memory cell 111 is connected to a word line WL. The amount of charges corresponding to multi-bit data may be charged in the cell capacitor Cs. The amount of charges corresponding to the multi-bit data stored in the cell capacitor Cs may be maintained and managed through a periodic refresh operation.

To sense the multi-bit data stored in the memory cell 111, the isolation transistor NMi is turned on, and the bit line pair BL and BLB is precharged. Afterwards, if the word line WL is activated to select the memory cell 111, charges corresponding to the multi-bit data stored in the memory cell 111 are shared with the bit line BL. In this case, the first latch 152 senses a voltage of the bit line BL changed through the process of charge sharing. In the case where the multi-bit data stored in the cell capacitor Cs are 2-bit data, the first latch 152 may sense a voltage of the bit line BL, which is developed to one of four levels through the process of charge sharing.

If the first latch 152 senses a voltage level of the bit line BL and completely latches the most significant bit MSB, the switches SW1 and SW2 may be turned off, and the switches SW3 and SW4 may be turned on. In this case, the most significant bit MSB may be transmitted to the second latch 154. As described above, the most significant bit MSB latched in the first latch 152 are transmitted to and inverted in the second latch 154. The second latch 154 maintains a logical value corresponding to the most significant bit MSB. To this end, the switches SW5 and SW6 may maintain a turn-off state.

Then, a least significant bit LSB is sensed by the first latch 152. For the first latch 152 to sense the least significant bit LSB, the switches SW1 and SW2 are turned on, and the switches SW3 and SW4 are turned off. In this case, a trip voltage of the first latch 152 may be different from that upon sensing the most significant bit MSB. As an example, the sensing enable voltages VSS1 and VDD1 may be changed upon sensing the least significant bit LSB. As another example, the sensing enable voltages VSS1 and VDD1 provided to the first latch 152 may be blocked upon sensing the least significant bit LSB. After the sensing enable voltages VSS1 and VDD1 are blocked, the pull-up and pull-down terminals of the first latch 152 may be floated. If the least significant bit LSB is completely sensed by the first latch 152, multi-bit data that are stored in the first latch 152 and the second latch 154 may be output to an input/output line I/O depending on a column select signal. However, a configuration and an operation associated with outputting the multi-bit data may be omitted.

The sensing enable voltages VDD1 and VSS1 are provided to the pull-up and pull-down terminals of the first latch 152. The first delta voltage $\Delta V1$ by which sensed data are amplified corresponds to a difference between the sensing enable voltages VDD1 and VSS1. The sensing enable voltages VDD2 and VSS2 are provided to the pull-up and pull-down terminals of the second latch 154. The second delta voltage $\Delta V2$ by which sensed data are amplified corresponds to a difference between the sensing enable voltages VDD2 and VSS2. To restore sensed multi-bit data, the second delta voltage $\Delta V2$ may be set to, for example, two times the magnitude of the first delta voltage $\Delta V1$.

When multi-bit data are completely sensed and latched by the first latch 152 and the second latch 154, there is performed a restore operation for charging the cell capacitor Cs with charges, the amount of which corresponds to multi-bit data stored in the first latch 152 and the second latch 154. In the restore operation, the first latch 152 charges the bit line BL with a voltage of a level corresponding to the least significant bit LSB. In contrast, the second latch 154 charges the complementary bit line BLB with a voltage of a level corresponding to the most significant bit MSB. A level of a voltage for charging the complementary bit line BLB to the most significant bit MSB is set to two times a level of a voltage for charging the bit line BL to the least significant bit LSB. Accordingly, if the switches SW1 and SW6 are turned on, the bit line BL may be charged with charges, the amount of which corresponds to the least significant bit LSB, and the complementary bit line BLB may be charged with charges, the amount of which corresponds to the most significant bit MSB. Afterwards, if the transmission gate TG is turned on, charges corresponding to the multi-bit data may be restored in the cell capacitor Cs.

Figure 7:
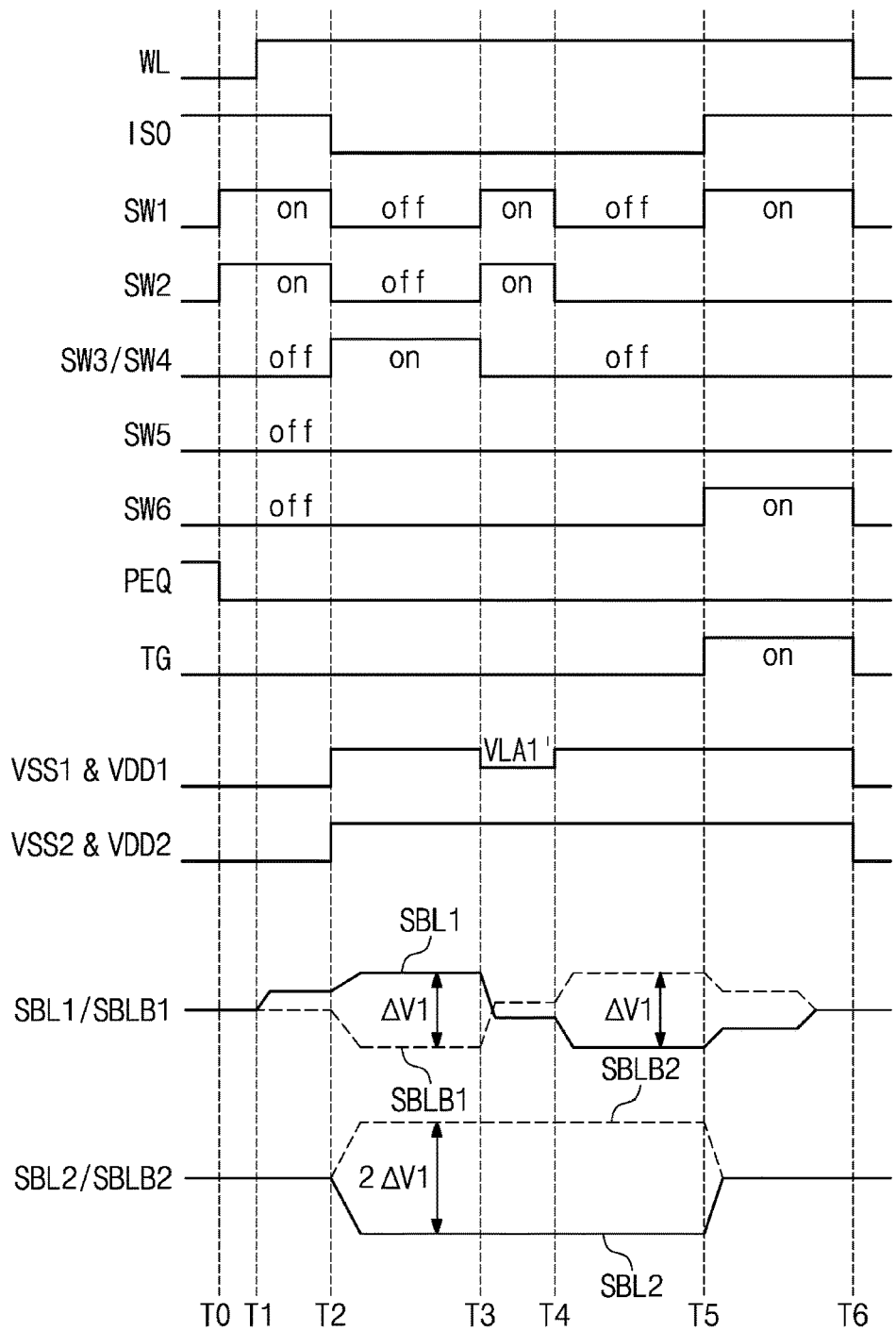
FIG. 7 is a timing diagram illustrating an operation of a bit line sense amplifier of FIG. 6 according to example embodiments.

FIG. 7 is a timing diagram illustrating an operation of a bit line sense amplifier of FIG. 6 according to example embodiments. Referring to FIG. 7, the bit line sense amplifier 150a of the inventive concept may sequentially sense multi-bit data stored in the memory cell 111 and may restore the sensed multi-bit data.

At a time point T0, it is assumed that the bit line pair BL and BLB is already precharged. That is, a precharge signal PEQ is illustrated as transitioning from a high level to a low level at the time point T0. In this case, the bit line pair BL and BLB may be set to an equalized level, for example, VDD/2. Here, VDD may be a power supply voltage. At the time point T0, an isolation signal ISO maintains the high level. The switches SW3, SW4, SW5, and SW6 remain at a turn-off state even after the time point T0. In contrast, at the time point T0, the switch SW1 connecting the first latch 152 and the bit line BL and the switch SW2 connecting the first latch 152 and the complementary bit line BLB are turned on.

At a time point T1, the word line WL is activated. At this time, charges stored in the cell capacitor Cs are shared with the bit line BL. A voltage of the bit line BL is changed through the process of charge sharing. The voltage of the bit line BL is illustrated in FIG. 7 as slightly increasing. At the same time, voltages of input nodes of the first latch 152 connected with the bit line pair BL and BLB through the switches SW1 and SW2 may also change. For example, voltages of the output nodes of the first latch 152 (e.g., a first sense amplifier bit line SBL1 and a first inverted sense amplifier bit line SBLB1) as input nodes of the first latch 152 may change like the bit line pair BL and BLB.

At a time point T2, the isolation signal ISO transitions to the low level, the bit line BL and the memory cell 111 are isolated from each other. In this case, the switches SW1 and SW2 are turned off, and the switches SW3 and SW4 are turned on. At the same time, the sensing enable voltages VSS1 and VDD1 corresponding to a latch driving voltage are provided to the latch 152, and the sensing enable voltages VSS2 and VDD2 corresponding to a latch driving voltage are provided to the latch 154. The sensing enable voltages VSS2 and VDD2 may be provided after the sensing enable voltages VSS1 and VDD1 are provided. For example, the sense amplifier control circuit 180 may control the latch voltage generator 190 to determine when provide each of the sensing enable voltages VSS1, VSS2, VDD1, and VDD2. As the sensing enable voltages VSS1 and VDD1 are provided, the node voltages of the first sense amplifier bit line SBL1 and the first inverted sense amplifier bit line SBLB1 of the first latch 152 may be amplified. For example, the most significant bit MSB latched in the first latch 152 may be transmitted to and inverted in the second latch 154.

In this case, a voltage difference corresponding to the first delta voltage $\Delta V1$ is formed between the pull-up and pull-down terminals of the first latch 152. For example, in the first latch 152, a difference between the sensing enable voltage VSS1 provided to the pull-down terminal and the sensing enable voltage VDD1 provided to the pull-up terminal corresponds to the first delta voltage ΔV1. Also, a voltage difference corresponding to the second delta voltage ΔV2 is formed between the pull-up and pull-down terminals of the second latch 154. A level of the first delta voltage ΔV1 may be different from a level of the second delta voltage ΔV2. For example, the second delta voltage ΔV2 for storing the most significant bit MSB may be set to two times the magnitude of the first delta voltage ΔV1 for storing the least significant bit LSB.

From the time point T0 to the time point T2, the sensing enable voltages VSS1, VSS2, VDD1, and VDD2 are not provided to the first and second latches 152 and 154 thus the pull-up and pull-down terminals of the first and second latches 152 and 154 may be floated.

At a time point T3, the switches SW1 and SW2 are turned on, and the switches SW3 and SW4 are turned off. In addition, the sensing enable voltages VSS2 and VDD2 for driving the second latch 154 are continuously provided, while the sensing enable voltages VSS1 and VDD1 for driving the first latch 152 are blocked. At this time, the bit line BL and the first sense amplifier bit line SBL1 of the first latch 152 are connected to each other and a voltage on the first sense amplifier bit line SBL1 may be changed by sharing with the bit line BL. Thus, the reference voltages of the first latch 152 when sensing the first bit may be changed. As such, a voltage maintained in the bit line BL is sensed by the first latch 152. As an example, the sensing enable voltages VSS1 and VDD1 of the first latch 152, which has a different level VLA1', may be provided to sense the least significant bit LSB. The different level VLA1' may include various voltage levels. As another example, the sensing enable voltages VSS1 and VDD1 of the first latch 152 may be blocked so that the pull-up and pull-down terminals of the first latch 152 are floated to sense the least significant bit LSB.

At a fourth time point T4, the switches SW1 and SW2 are turned off, and a driving voltage of the first latch 152 may return to a level of the sensing enable voltages VSS1 and VDD1. In this case, a voltage corresponding to a logical value of the least significant bit LSB sensed by the first latch 152 is amplified. After the fourth time point T4, multi-bit data are latched in the first latch 152 and the second latch 154. Although not illustrated in FIG. 7, data latched in the bit line sense amplifier 150a may be output by activating a column select signal CSL.

At a fifth time point T5, a restore operation of the multi-bit data latched in the first latch 152 and the second latch 154 may be performed. If the switch SW1 is turned on while the switch SW2 is in a turn-off state, the bit line BL may be charged by the sensing enable voltage VSS1 or VDD1 corresponding to the least significant bit LSB latched in the first latch 152. If the switch SW6 is turned on while the switch SW5 is in a turn-off state, the complementary bit line BLB may be charged by the sensing enable voltage VSS2 or VDD2 corresponding to the most significant bit MSB latched in the second latch 154. If, in such a state, the isolation signal ISO is activated and the transmission gate TG is turned on, charges corresponding to multi-bit data may be stored in the cell capacitor Cs of the memory cell 111 through the bit line BL.

An operating method of a bit line sense amplifier illustrated in FIG. 6 is above exemplified with reference to the timing diagram of FIG. 7. However, it may be well understood that a method of sensing and restoring multi-bit data is not limited to the switching manner illustrated in FIG. 7.

Figure 8:
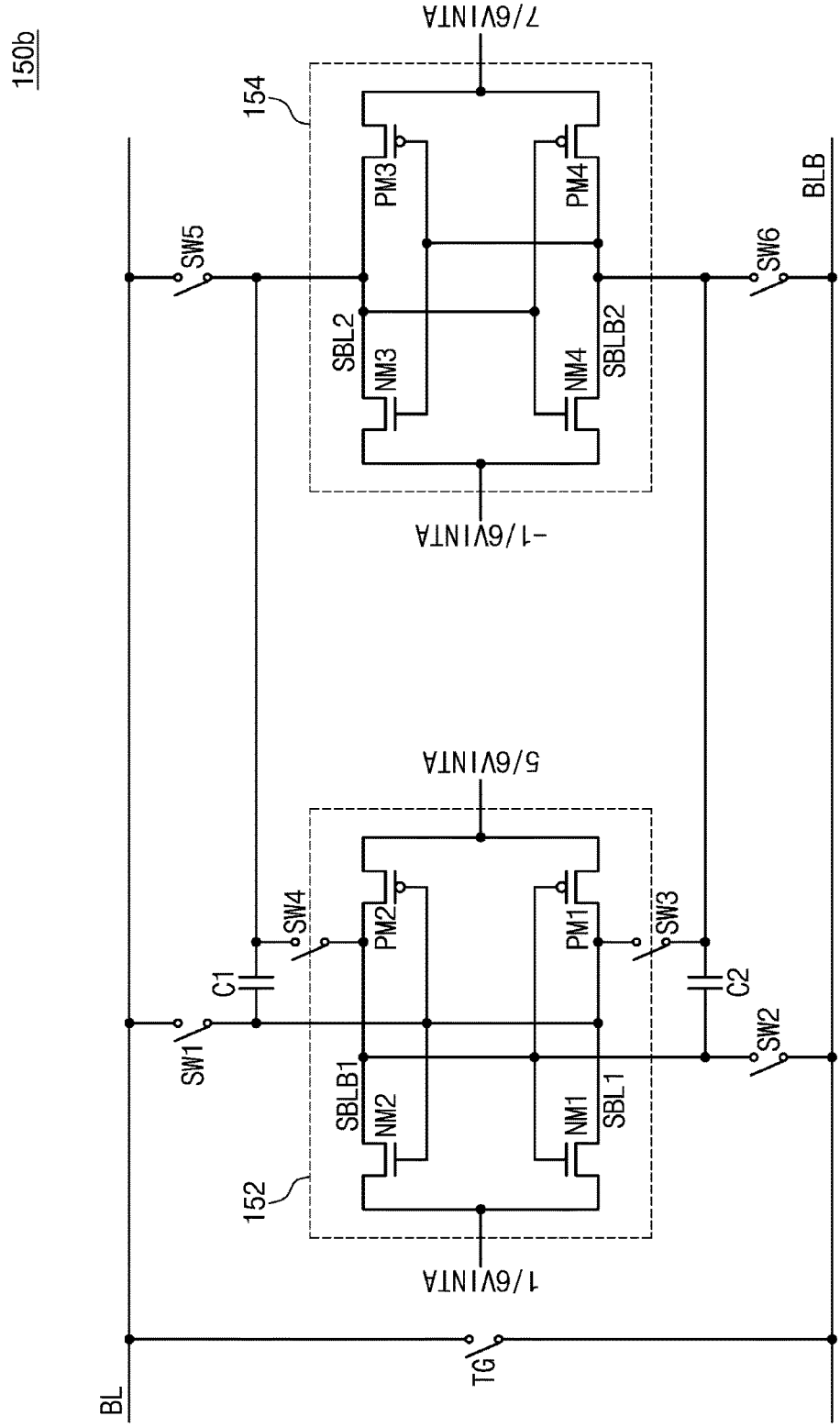
FIG. 8 is a circuit diagram illustrating a bit line sense amplifier according to example embodiments.

FIG. 8 is a circuit diagram illustrating a bit line sense amplifier according to another embodiment of the inventive concept. Referring to FIG. 8, a bit line sense amplifier 150b includes the first latch 152, the second latch 154, and the transmission gate TG. A first coupling capacitor C1 and a second coupling capacitor C2 may be connected between the first latch 152 and the second latch 154.

The first latch 152 senses data by using sensing enable voltages 1/6VINTA and 5/6VINTA. The first latch 152 may include PMOS transistors PM1 and PM2 for constituting a pull-up stage and NMOS transistors NM1 and NM2 for constituting a pull-down stage. The first latch 152 senses a voltage change of the bit line BL to latch data stored in the memory cell 111. A drain of the PMOS transistor PM1 or a drain of the NMOS transistor NM1 forms a first sense amplifier bit line SBL1. A drain of the PMOS transistor PM2 or a drain of the NMOS transistor NM2 forms a first inverted sense amplifier bit line SBLB1. The first sense amplifier bit line SBL1 and the first inverted sense amplifier bit line SBLB1 may operate as an input node or an output node of the first latch 152.

For example, in a sensing operation of the first latch 152, the switches SW1 and SW2 may be turned on, and thus, voltage changes of the bit line pair BL and BLB may be transmitted to the first sense amplifier bit line SBL1 and the first inverted sense amplifier bit line SBLB1. In contrast, after data are completely sensed, the switches SW1 and SW2 are turned off, and the switches SW3 and SW4 are turned on. For example, a most significant bit MSB sensed by the first latch 152 is transmitted to the second latch 154 through the switches SW3 and SW4. As such, a voltage level defined by the first sense amplifier bit line SBL1 and the first inverted sense amplifier bit line SBLB1 after sensing the most significant bit MSB is transmitted to and inverted in the second latch 154.

When the most significant bit MSB sensed by the first latch 152 is transmitted to the second latch 154, the switches SW3 and SW4 are turned off. Depending on a logical value corresponding to the most significant bit MSB transmitted, voltages of the second inverted sense amplifier bit line SBLB2 and the second sense amplifier bit line SBL2 are amplified to sensing enable voltages −1/6VINTA and 7/6VINTA through the pull-up and pull-down process. That is, the most significant bit MSB transmitted from the first latch 152 is latched by the second latch 154 as a level of the second delta voltage ΔV2 (e.g., 8/6VINTA).

As node voltages of the second inverted sense amplifier bit line SBLB2 and the second sense amplifier bit line SBL2 are amplified to the level of the second delta voltage ΔV2, voltages of input and output nodes of the first latch 152 are changed by the coupling capacitors C1 and C2. For example, voltage levels of the first sense amplifier bit line SBL1 and the first inverted sense amplifier bit line SBLB1 are coupled according to voltage levels latched in the second latch 154. A logical value corresponding to the least significant bit LSB may be latched in the first latch 152 at a time point when the data transmitted to and inverted in the second latch 154 are amplified.

Afterwards, in a restore operation, the first latch 152 and the second latch 154 are connected to the bit line BL and the complementary bit line BLB, respectively. The bit line BL and the complementary bit line BLB are charged with the sensing enable voltages 1/6VINTA, 5/6VINTA, −1/6VINTA, and 7/6VINTA corresponding to logical values of the least significant bit LSB and the most significant bit MSB respectively stored in the first latch 152 and the second latch 154. Afterwards, charges that are charged in the bit line pair BL and BLB and correspond to multi-bit data may be charged in the cell capacitor Cs.

The second latch 154 senses data by using sensing enable voltages −1/6VINTA and 7/6VINTA. The second latch 154 may include PMOS transistors PM3 and PM4 for constituting a pull-up stage and NMOS transistors NM3 and NM4 for constituting a pull-down stage. The second latch 154 may not perform sensing on the bit line pair BL and BLB. A drain of the PMOS transistor PM3 or a drain of the NMOS transistor NM3 forms a second sense amplifier bit line SBL2. A drain of the PMOS transistor PM4 or a drain of the NMOS transistor NM4 forms a second inverted sense amplifier bit line SBLB2. The second sense amplifier bit line SBL2 and the second inverted sense amplifier bit line SBLB2 may operate as an input node or an output node of the second latch 154.

The sensing enable voltages −1/6VINTA and 7/6VINTA are provided to the pull-down and pull-up terminals of the second latch 154. Accordingly, a voltage "8/6VINTA" that is the second delta voltage ΔV2 corresponding to a voltage difference of the pull-up and pull-down terminals of the second latch 154 may be formed. The sensing enable voltages −1/6VINTA and 7/6VINTA may be provided by the latch voltage generator 190 (refer to FIG. 1) described above.

In the restore operation, when the transmission gate TG is turned on, charges of the bit line pair BL and BLB charged by the sensing enable voltages 1/6VINTA, 5/6VINTA, −1/6VINTA, and 7/6VINTA are transmitted to the cell capacitor Cs of the memory cell 111. In the restore operation, the switches SW2, SW3, SW4, and SW5 may maintain a turn-off state.

Figure 9:
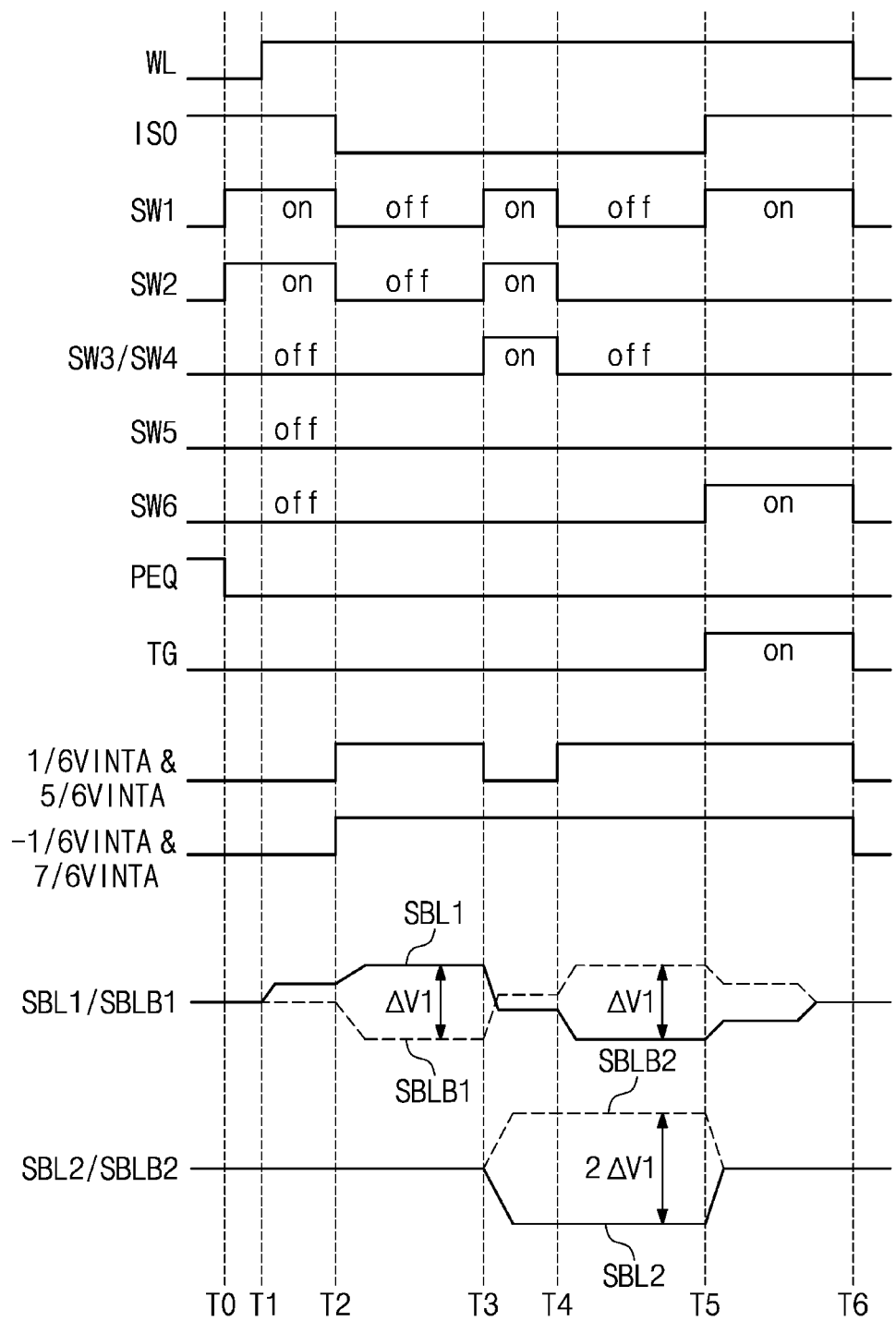
FIG. 9 is a timing diagram illustrating an operation of a bit line sense amplifier of FIG. 8 according to example embodiments.

FIG. 9 is a timing diagram illustrating an operation of a bit line sense amplifier of FIG. 8 according to example embodiments. Referring to FIG. 9, the bit line sense amplifier 150b of the inventive concept may sequentially sense multi-bit data stored in the memory cell 111 and may restore the sensed multi-bit data. Although not illustrated in FIG. 8, it may be well understood that the memory cell 111, the isolation transistor MNi, and a precharge circuit 156 are included as illustrated in FIG. 6.

At a time point T0, it is assumed that the bit line pair BL and BLB is already precharged. That is, a precharge signal PEQ is illustrated as transitioning from a high level to a low level at the time point T0. In this case, the bit line pair BL and BLB may be set to an equalized level, for example, VDD/2. At the time point T0, an isolation signal ISO maintains the high level. The switches SW3, SW4, SW5, and SW6 remain at a turn-off state even after the time point T0. In contrast, at the time point T0, the switch SW1 connecting the first latch 152 and the bit line BL and the switch SW2 connecting the first latch 152 and the complementary bit line BLB are turned on.

At a time point T1, the word line WL is activated. At this time, charges stored in the cell capacitor Cs are shared with the bit line BL. A voltage of the bit line BL is changed through the process of charge sharing. The voltage of the bit line BL is illustrated in FIG. 9 as slightly increasing. At the same time, voltages of input nodes of the first latch 152 connected with the bit line pair BL and BLB through the switches SW1 and SW2 may also change. For example, voltages of output nodes of the first latch 152 (e.g., first sense amplifier bit line SBL1 and the first inverted sense amplifier bit line SBLB1) as input nodes of the first latch 152 may change like the bit line pair BL and BLB.

At a time point T2, the isolation signal ISO transitions to the low level, the bit line BL and the memory cell 111 are isolated from each other. In this case, the switches SW1 and SW2 are turned off, and the switches SW3 and SW4 are turned on. At the same time, the sensing enable voltages 1/6VINTA and 5/6VINTA corresponding to a latch driving voltage are provided to the first latch 152, and the sensing enable voltages −1/6VINTA and 7/6VINTA corresponding to a latch driving voltage are provided to the second latch 154. The sensing enable voltages −1/6VINTA and 7/6VINTA may be provided after the sensing enable voltages 1/6VINTA and 5/6VINTA are provided. For example, the sense amplifier control circuit 180 may control the latch voltage generator 190 to determine when provide each of the sensing enable voltages −1/6VINTA, 1/6VINTA, 5/6VINTA, and 7/6VINTA. As the sensing enable voltages 1/6VINTA and 5/6VINTA are provided, the node voltages of the first sense amplifier bit line SBL1 and the first inverted sense amplifier bit line SBLB1 of the first latch 152 are amplified. For example, the most significant bit MSB latched in the first latch 152 may be transmitted to and inverted in the second latch 154.

In this case, a voltage difference corresponding to the first delta voltage ΔV1 is formed between the pull-up and pull-down terminals of the first latch 152. For example, in the first latch 152, a difference between the sensing enable voltage 1/6VINTA provided to the pull-down terminal and the sensing enable voltage 5/6VINTA provided to the pull-up terminal corresponds to the first delta voltage ΔV1 (e.g., 4/6VINTA). Also, a voltage difference corresponding to the second delta voltage ΔV2 is formed between the pull-up and pull-down terminals of the second latch 154. A level of the first delta voltage ΔV1 may be different from a level of the second delta voltage ΔV2. For example, the second delta voltage ΔV2 for storing the most significant bit MSB may be set to two times the magnitude of the first delta voltage ΔV1 for storing the least significant bit LSB.

From the time point T0 to the time point T2, the sensing enable voltages −1/6VINTA, 1/6VINTA, 5/6VINTA, and 7/6VINTA are not provided to the first and second latches 152 and 154 thus the pull-up and pull-down terminals of the first and second latches 152 and 154 may be floated.

At a time point T3, the switches SW1 and SW2 are turned on, and the switches SW3 and SW4 are turned on. As the switches SW3 and SW4 are turned on, data sensed by the first latch 152 are transmitted to and inverted in the second latch 154. The first sense amplifier bit line SBL1 and the first inverted sense amplifier bit line SBLB1 of the first latch 152 are respectively coupled according to voltage changes of the second inverted sense amplifier bit line SBLB2 and the second sense amplifier bit line SBL2 of the second latch 154 by the coupling capacitors C1 and C2. Accordingly, the first latch 152 may sense the least significant bit LSB without changing reference voltages. The sensing enable voltages −1/6VINTA and 7/6VINTA for driving the second latch 154 are continuously provided, while the sensing enable voltages 1/6VINTA and 5/6VINTA for driving the first latch 152 are blocked. As such, a voltage maintained in the bit line BL is sensed by the first latch 152.

At a fourth time point T4, the switches SW1 and SW2 are turned off, and driving voltages of the first latch 152 may return to levels of the sensing enable voltages 1/6VINTA and 5/6VINTA. In this case, a voltage corresponding to a logical value of the least significant bit LSB sensed by the first latch 152 is amplified. After the fourth time point T4, multi-bit data are latched in the first latch 152 and the second latch 154. Although not illustrated in FIG. 9, data latched in the bit line sense amplifier 150b may be output by activating a column select signal CSL.

At a fifth time point T5, a restore operation of the multi-bit data latched in the first latch 152 and the second latch 154 may be performed. If the switch SW1 is turned on while the switch SW2 is in a turn-off state, a sensing enable voltage 1/6VINTA or 5/6VINTA corresponding to the least significant bit LSB latched in the first latch 152 may be transmitted to the bit line BL. If the switch SW6 is turned on while the switch SW5 is in a turn-off state, a sensing enable voltage −1/6VINTA or 7/6VINTA corresponding to the most significant bit MSB latched in the second latch 154 may be transmitted to the complementary bit line BLB. If, in such a state, the isolation signal ISO is activated and the transmission gate TG is turned on, charges corresponding to multi-bit data may be stored in the cell capacitor Cs of the memory cell 111 through the bit line BL.

An operating method of a bit line sense amplifier illustrated in FIG. 9 is above exemplified. However, it may be well understood that a method of sensing and restoring multi-bit data is not limited to the manner illustrated in FIG. 9.

Figure 10:
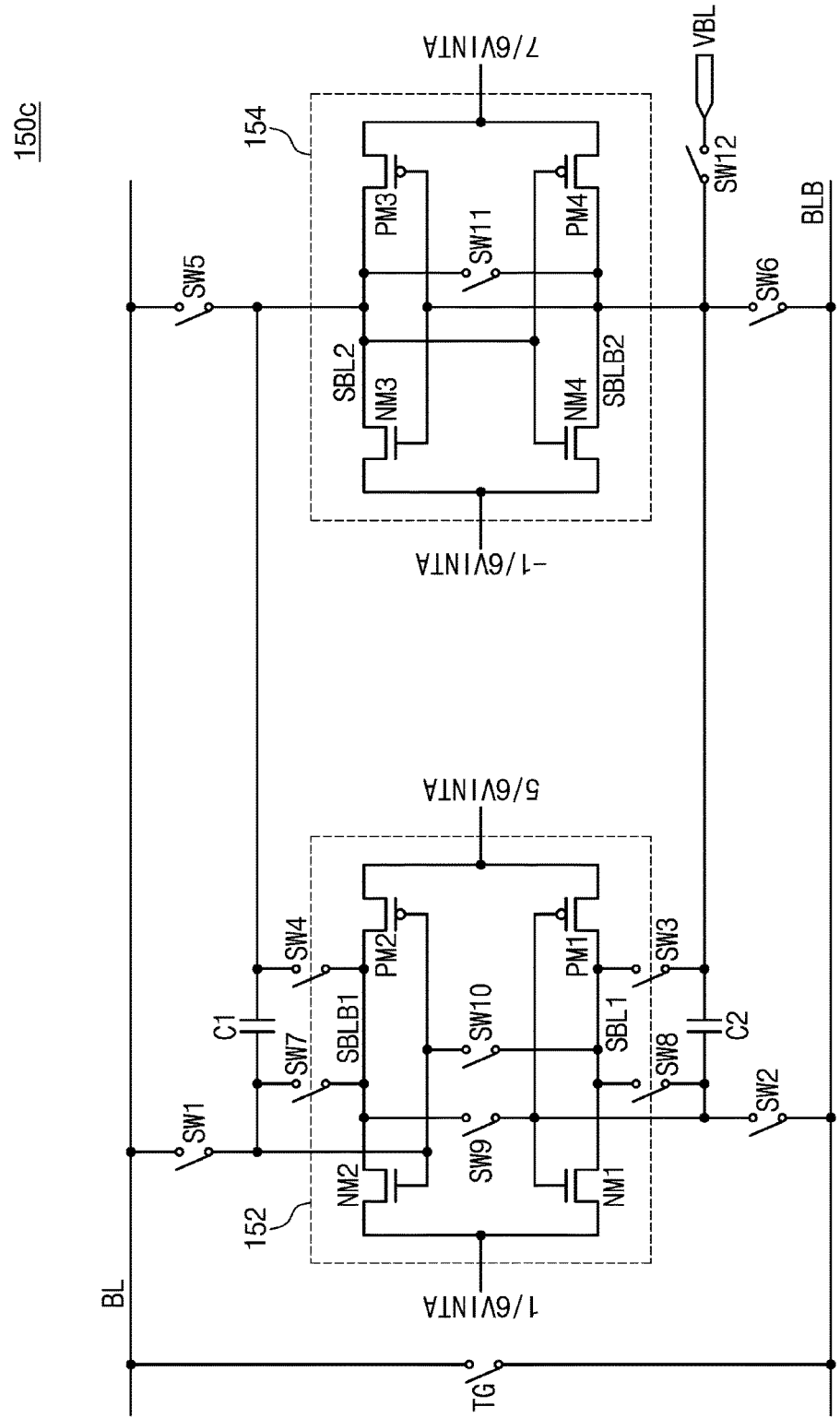
FIG. 10 is a circuit diagram illustrating a bit line sense amplifier according to example embodiments.

FIG. 10 is a circuit diagram illustrating a bit line sense amplifier according to another embodiment of the inventive concept. Referring to FIG. 10, a bit line sense amplifier 150c includes the first latch 152, the second latch 154, and the transmission gate TG. A first coupling capacitor C1 and a second coupling capacitor C2 may be connected between the first latch 152 and the second latch 154. For example, the first latch 152 performing sensing of multi-bit data may perform an offset cancellation operation.

The first latch 152 senses data by using sensing enable voltages 1/6VINTA and 5/6VINTA. In an embodiment, the first latch 152 may perform the offset cancellation operation after a precharge operation for performing sensing. To this end, the first latch 152 may include switches SW7, SW8, SW9, and SW10. The switches SW9 and SW10 are turned off for offset cancellation. In the precharge operation, the switches SW9 and SW10 may be in a turn-on state. The switches SW7 and SW8 are turned on for offset cancellation under control of the sense amplifier control circuit 180. At the same time, a pull-down driving voltage (a voltage of a common source node of the NMOS transistors NM1 and NM2) of the first latch 152 may transition from the precharge voltage, for example, VDD/2 to the sensing enable voltage 1/6VINTA and may again transition from the sensing enable voltage 1/6VINTA to the precharge voltage VDD/2. Likewise, a pull-up driving voltage (a voltage of a common source node of the PMOS transistors PM1 and PM2) of the first latch 152 may transition from the precharge voltage VDD/2 to the sensing enable voltage 5/6VINTA and may again transition from the sensing enable voltage 5/6VINTA to the precharge voltage VDD/2.

The first latch 152 may perform an offset cancellation operation by controlling the switches SW7, SW8, SW9, and SW10 and the sensing enable voltages 1/6VINTA and 5/6VINTA. A sensing operation and a restore operation of the first latch 152 are substantially the same as those described with reference to FIG. 8, and thus, a description thereof will not be repeated here.

Figure 11:
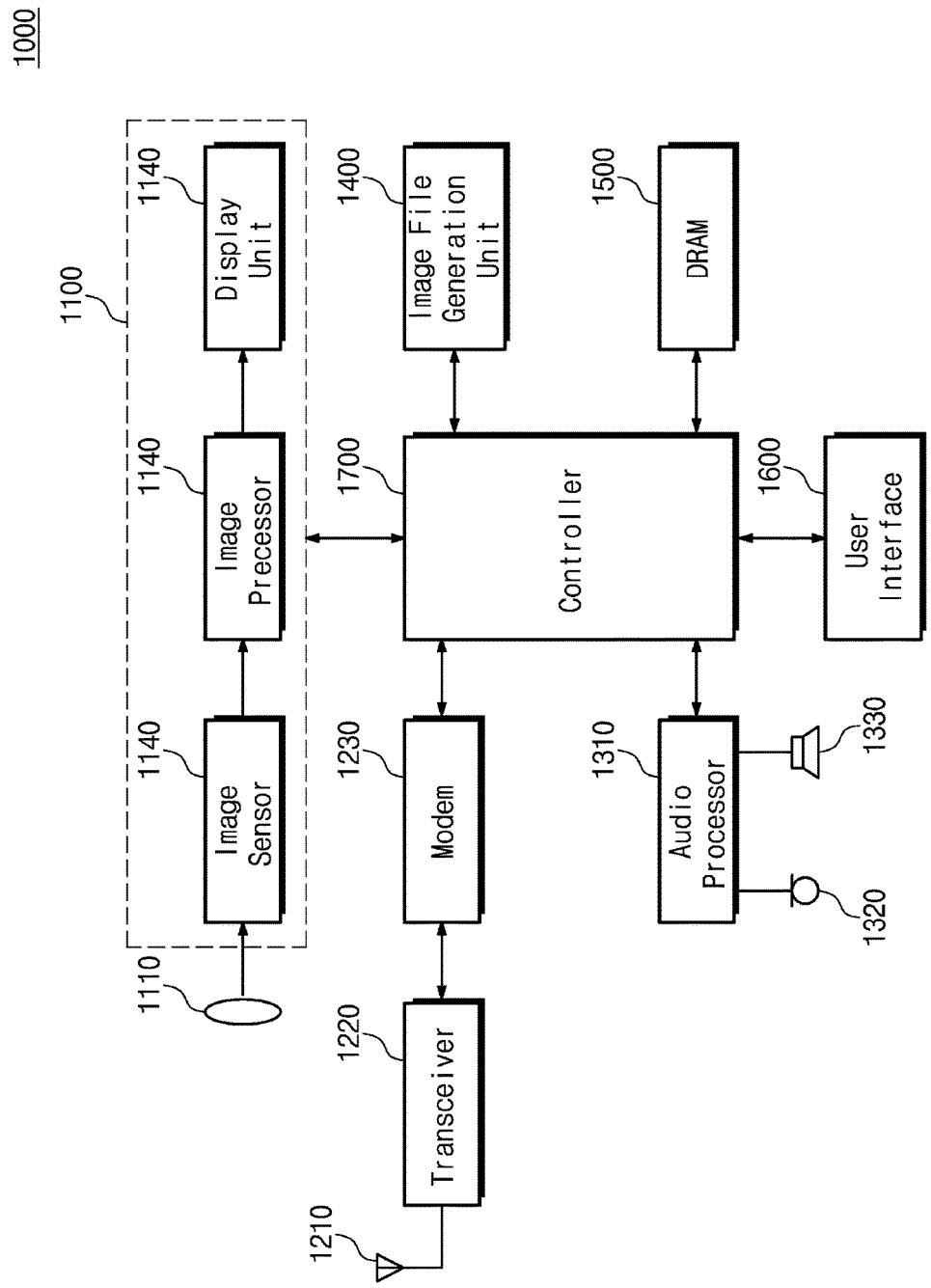
FIG. 11 is a block diagram illustrating a portable device including a semiconductor memory device according to certain embodiments.

FIG. 11 is a block diagram illustrating a portable device including a semiconductor memory device according to certain embodiments of the inventive concept. Referring to FIG. 11, a portable device 1000 includes an image processing unit 1100, a wireless transceiver unit 1200, an audio processing unit 1300, an image file generation unit 1400, a DRAM 1500, a user interface 1600, and a controller 1700.

The image processing unit 1100 may include a lens 1110, an image sensor 1120, an image processor 1130, and a display unit 1140. The wireless transceiver unit 1200 includes an antenna 1210, a transceiver 1220, and a modulator/demodulator (modem) 1230. The audio processing unit 1300 includes an audio processor 1310, a microphone 1320, and a speaker 1330. The image file generation unit 1400 may be a component for generating an image file within the portable device 1000. The DRAM 1500 may be provided as a working memory of the portable device 1000. The user interface 1600 may be a component for receiving a user input signal.

Here, the DRAM 1500 may be implemented with a mobile DRAM. A bit line sense amplifier (not illustrated) of the DRAM 1500 may be the same as one of the bit line sense amplifiers disclosed herein and may sense and latch multi-bit data with high reliability. Accordingly, the DRAM 1500 of a high capacity and high integrity of data may be provided.

According to an embodiment of the inventive concept, it may be possible to sense multi-bit data of high integrity in a semiconductor memory device having an open bit line structure.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A semiconductor memory device comprising:
   a memory cell connected to a bit line and configured to store multi-bit data; and
   a bit line sense amplifier including a first latch and a second latch, and configured to electrically connect to the bit line and a complementary bit line in an open bit line structure,
   wherein the first latch is configured to sequentially sense a first bit of the stored multi-bit data and transmit the sensed first bit as a first output voltage and an inverted first output voltage to the second latch, and sense a second bit of the stored multi-bit data and output the sensed second bit as a second output voltage and an inverted second output voltage, and
   the second latch is configured to sense the transmitted bit from the first latch and output the sensed transmitted bit as a third output voltage and an inverted third output voltage.

2. The semiconductor memory device of claim 1, wherein the bit line sense amplifier further includes:
   a first switch configured to connect a first output node of the first latch to the bit line;
   a second switch configured to connect a second output node of the first latch to the complementary bit line;
   a third switch connects the first output node of the first latch a first input node of the second latch;
   a fourth switch connects the second output node of the first latch to a second input node of the second latch; and
   a fifth switch configured to connect a second output node of the second latch to the complementary bit line.

3. The semiconductor memory device of claim 1, wherein the semiconductor memory device is further comprises a first isolation transistor connected to the bit line and a second isolation transistor connected to the complementary bit line, and
   wherein, before the first latch senses the first bit, a sense amplifier control circuit of the semiconductor memory device is configured such that the first isolation transistor is turned on and the second isolation transistor is turned off.

4. The semiconductor memory device of claim 1, wherein the bit line sense amplifier is configured such that the first latch uses different reference voltages upon sensing the first bit and upon sensing the second bit.

5. The semiconductor memory device of claim 1, wherein the bit line sense amplifier is configured such that, in a restore operation of the multi-bit data, the first latch charges the bit line with a voltage corresponding to the sensed second bit, and the second latch charges the complementary bit line with the inverted third output voltage.

6. The semiconductor memory device of claim 5, wherein the bit line sense amplifier further includes:
a transmission gate configured to connect the bit line and the complementary bit line in the restore operation.

7. The semiconductor memory device of claim 1, wherein the first latch is configured to sense the first and second bits based on voltages of the bit line and the complementary bit line.

8. The semiconductor memory device of claim 1, wherein the bit line sense amplifier further includes:
a first coupling capacitor connected between a first output node of the first latch and a second input node of the second latch; and
a second coupling capacitor connected between a second output node of the first latch and a first input node of the second latch.

9. The semiconductor memory device of claim 1, further comprising:
a latch voltage generator configured to provide a first pull-up driving voltage and a first pull-down driving voltage lower than the first pull-up driving voltage to the first latch and a second pull-up driving voltage and a second pull-down driving voltage lower than the second pull-up driving voltage to the second latch,
wherein a first voltage difference between the first pull-up driving voltage and the first pull-down driving voltage is lower than a second voltage difference between the second pull-up driving voltage and the second pull-down driving voltage.

10. The semiconductor memory device of claim 9, wherein the second voltage difference is two times the first voltage difference.

11. The semiconductor memory device of claim 9, wherein the latch voltage generator is configured to block providing the first pull-up driving voltage and the first pull-down driving voltage to the first latch before sensing the second bit.

12. The semiconductor memory device of claim 1, wherein the first and second latches are configured to electrically connect to the complementary bit line through first and second switches, respectively, and
a first end of each of the first and second switches is directly connected to the complementary bit line.

13. A semiconductor memory device comprising:
a bit line connected to a memory cell configured to store multi-bit data;
a complementary bit line provided as an open bit line;
a first latch connected to the bit line and the complementary bit line through a first switch and a second switch, respectively, and configured to sequentially sense a first bit of the stored multi-bit data and a second bit of the stored multi-data based on voltages of the bit line and the complementary bit line, and a second latch connected to the first latch through third and fourth switches and connected to the complementary bit line through a fifth switch, and the second latch configured to receive the sensed first bit from the first latch and sense the received bit.

14. The semiconductor memory device of claim 13, wherein the second latch is configured to transmit the sensed first bit to the second latch through the third and fourth switches.

15. The semiconductor memory device of claim 13, further comprising:
a first coupling capacitor connected between a first output node of the first latch and a second input node of the second latch; and
a second coupling capacitor connected between a second output node of the first latch and a first input node of the second latch.

16. The semiconductor memory device of claim 13, wherein the first latch includes a first inverter and a second inverter cross coupled to each other, and
wherein the first latch is configured to perform an offset cancellation operation by connecting an input node with an output node of the first inverter and by connecting an input node with an output node of the second inverter.

17. The semiconductor memory device of claim 13, wherein the semiconductor memory device further comprising:
a transmission gate configured to connect to the bit line and the complementary bit line by using the first and fifth switches in a restore operation.

18. A multi-bit data sensing method of a semiconductor memory device formed in an open bit line structure, the method comprising:
sensing a first bit of the multi-bit data stored in a memory cell by a first latch;
transmitting the sensed first bit to a second latch;
sensing the transmitted bit by the second latch;
sensing a second bit of the multi-bit data by the first latch; and
restoring a first voltage stored in the second latch and a second voltage stored in the first latch corresponding to the sensed second bit, to the memory cell.

19. The method of claim 18, wherein the restoring of the first voltage includes charging the first voltage to a complementary bit line,
wherein the restoring of the second voltage includes charging the second voltage to a bit line connected to the memory cell, and
wherein the restoring of the first and second voltages includes electrically connecting the bit line with the complementary bit line.

20. The method of claim 18, wherein the sensing of the first bit includes providing a first pull-up driving voltage and a first pull-down driving voltage lower than the first pull-up driving voltage, to the first latch,
wherein the sensing of the transmitted bit includes providing a second pull-up driving voltage and a second pull-down driving voltage lower than the second pull-up driving voltage, to the second latch, and
wherein a first voltage difference between the first pull-up driving voltage and the first pull-down driving voltage is lower than a second voltage difference between the second pull-up driving voltage and the second pull-down driving voltage.

* * * * *